Sept. 3, 1968

B. E. BRILEY 3,400,381

RECIRCULATING DELAY LINE MEMORY

Filed April 2, 1965

INVENTOR
BRUCE E. BRILEY

BY C. A. Gulbrandsen
ATTY.

United States Patent Office 3,400,381
Patented Sept. 3, 1968

3,400,381

RECIRCULATING DELAY LINE MEMORY

Bruce E. Briley, La Grange Park, Ill., assignor to Automatic Electric Laboratories, Inc., Northlake, Ill., a corporation of Delaware Filed Apr. 2, 1965, Ser. No. 445,036
8 Claims. (Cl. 340—173)

This invention relates in general to digital memory devices and in particular to recirculating delay line memory arrangements.

In the past, multistage amplifiers and the appropriate logic circuits have been combined with a delay line to accomplish sequential, recirculating storage of digital information. Because the pulses are distorted after being transmitted through the delay line, pulse reshaping networks are usually required. These techniques are well suited to long delay, large capacity systems; but to employ the same technique in a short delay, small capacity system would make the cost per bit prohibitively high.

Therefore, it is the object of this invention to provide a simplified recirculating memory device having small storage capacity and fast access to stored information.

A copending application, now Patent No. 3,349,252, of this inventor, Ser. No. 351,999, filed Mar. 16, 1964, discloses a flip-flop which employs a diode switch to control the input of a sinusoidal signal to the base of a single junction-type transistor which is employed in a common-emitter configuration. The voltage on the collector of the transistor controls the operation of the switch by affecting the bias condition on the diodes. Thus, when the transistor is in the cutoff state, the voltage on the collector biases the diodes in the high resistance direction so that the sinusoidal signals are effectively blocked and do not reach the base of the transistor. When the transistor is in a saturated state, the voltage on the collector biases the diodes in the low resistance direction so that the sinusoidal signals are effectively coupled to the base of the transistor. The sinusoidal signals are chosen to have amplitude and frequency such that they maintain the transistor in a saturated state when coupled to the base.

In accordance with this invention, a delay line, preferably an electric delay line of the distributed parameter type, is incorporated between the diode switch and the base of the transistor. The delay line is capable of transmitting a pattern of sinusoidal signals with some attenuation, but very little distortion. The pattern of sinusoidal signals, upon reaching the base of the transistor, causes the transistor to assume a corresponding pattern of states. The pattern of sinusoidal signals on the delay line is continuously regenerated as the diode switch responds to the output of the transistor.

Other objects and a more complete understanding of this invention will be obtained by reading the following description in conjunction with the drawings in which.

Figure 1:
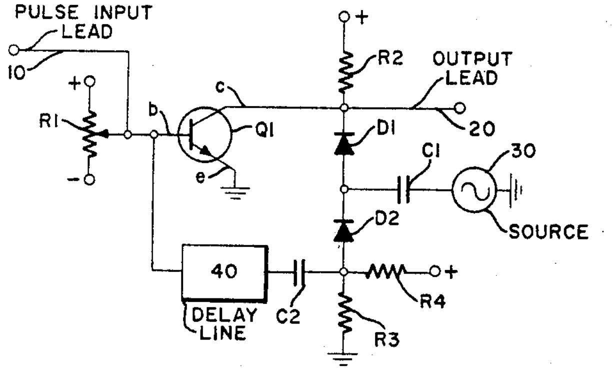
FIG. 1 is a schematic diagram of the recirculating memory arrangement of this invention.

Referring to FIG. 1, transistor Q1 with base *b*, collector *c*, and grounded emitter *e*, has its base *b* connected to voltage divider R1 at a point which biases the transistor Q1 to cutoff in the absence of signals on leads 10 and 50. The collector *c* is connected by way of resistor R2 to the positive voltage supply to establish the cutoff voltage level on the collector *c* and output lead 20. Pulse input lead 10 is connected to the base *b* of the transistor. Diodes D1 and D2 comprise a switch for the sinusoidal signal source 30. The cathode of diode D1 is connected to the junction of resistor R2 and collector *c*, the anode of diode D1 is connected to the cathode of diode D2, and at the junction between the two diodes the sinusoidal signal source 30 is connected to the switch through capacitor C1. The anode of diode D2 is connected to the junction of resistors R3 and R4, which act as a voltage divider to set the bias voltage on the anode of diode D2. The junction of resistors R3 and R4 is also connected to one end of the delay line 40 through capacitor C2. The other end of the delay line 40 is connected to the base *b* of transistor Q1 over lead 50.

As already noted, the voltage divider R1 biases transistor Q1 to cutoff. In the cutoff state, little current flows in the collector circuit of transistor Q1 so that collector *c* is at a potential nearly equal to the positive supply voltage. With this voltage on the collector, the diodes D1 and D2 are biased in the high resistance direction and the sinusoidal signals from source 30 are effectively blocked from the delay line 40. A positive pulse of sufficient voltage on pulse input lead 10 will cause transistor Q1 to assume a saturated state. In the saturated state a high current flows in the collector circuit so that the potential on the collector drops to a point near ground potential. With this potential on the collector, diodes D1 and D2 are biased in the low resistance direction and the sinusoidal signals from source 30 are coupled to the delay line 40. If the input pulse ceases before the sinusoidal signals are transmitted through the delay line 40, the transistor Q1 will again assume the cutoff state, and the sinusoidal signals will be blocked from the delay line.

However, the burst of sinusoidal signals already sent to the delay line will reach the base *b* over lead 50 after a period of delay has elapsed. Upon reaching the base, these signals cause the transistor to assume a saturated state; and since the diode switch is biased in the low resistance direction during this time, a fresh burst of sinusoidal signals is sent to the delay line 40. During the interval between the end of the first and the beginning of the second burst of sinusoidal signals to be transmitted to base *b*, the transistor Q1 will assume a cutoff state. When the second burst reaches the base *b*, the transistor Q1 will saturate again. It is obvious that this process will continue indefinitely unless the power is cut off or a signal on pulse input lead 10 changes the operation of the device. The theory of operation of the one-transistor flip-flop on which this invention rests has been adequately discussed in the copending application cited above and will not be repeated here. The circuit shown in FIG. 1 has been successfully operated with the following values for the components:

| | | |
|---|---|---|
| Reference voltages | volts | 6 |
| Resistance R1 | | 10K |
| Resistance R2 | | 10K |
| Resistance R3 | | 10K |
| Resistance R4 | | 10K |
| Capacitor C1 | pf | 100 |
| Capacitor C2 | pf | 100 |
| Source **30** | mc | 10 |
| Delay line **40** | μs | 1.5 |

Figure 2:
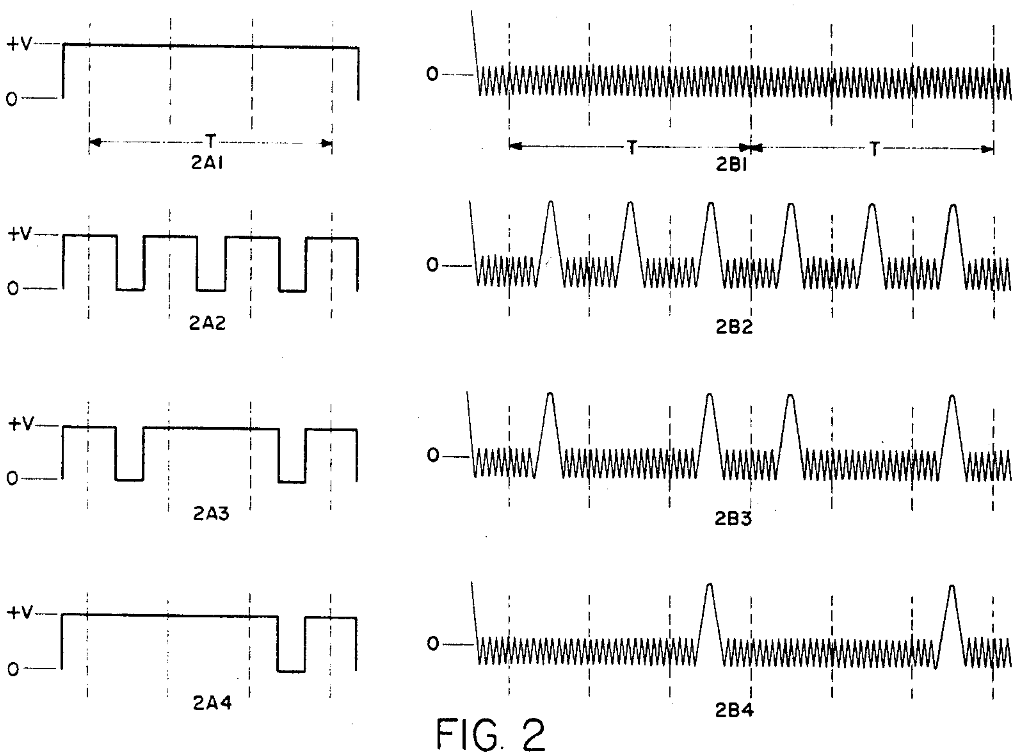
FIG. 2 is a drawing of the repetitive output signal patterns corresponding to the input pulse patterns.

FIG. 2 shows the output patterns (2B) resulting from various input pulse patterns (2A). In the examples shown, a positive pulse first saturates the transistor. If this pulse lasts throughout the total period of the delay $\tau$, as shown in 2A1, the output pattern is as shown in 2B1, the transistor remaining continuously in a saturated state. This state would continue until a further signal on pulse lead 10 changed it. If there are interruptions in the positive pulse during the delay period $\tau$, as shown in 2A2, 2A3, and 2A4, an output pattern is obtained as shown in 2B2, 2B3, and 2B4, in which the output voltage rises to a level near the supply voltage during periods corresponding to the initial periods in which the input pulse is interrupted.

The total delay period $\tau$ is slightly longer than the delay period for the delay line alone since there are inherent delays in the other components of the circuit.

It will be apparent to those skilled in the art that this invention is not limited to the storage of three bits of information. Also, other ways of reading in information are apparent from the above description. Therefore, it is to be understood that, while a specific embodiment is disclosed above, numerous changes could be made without departing from the scope of the invention as claimed.

What is claimed is:

1. A recirculating memory arrangement comprising, in combination:

bistable circuit means including a single transistor operating on the minority carrier storage principle;

input circuit means for transmitting a pattern of sinusoidal signals to said transistor to establish a corresponding pattern of operating states thereof; and regenerating means responsive to the state of said transistor to regenerate said transmitted pattern of sinusoidal signals.

2. A recirculating memory arrangement as claimed in claim 1, wherein said input circuit means includes a distributed parameter delay line.

3. A recirculating memory arrangement comprising, in combination:

circuit means including a single transistor with input and output electrodes, a biasing network with resistive elements connected to said input and output electrodes to bias said transistor normally to cutoff and to establish a first average voltage level on said output electrode during cutoff, said circuit responding to the application on said input electrode of a periodic signal of predetermined amplitude and frequency by assuming a state in which said transistor is saturated and a second average voltage level is established on said output electrode;

input circuit means for supplying a pattern of said periodic signals to said input electrode to establish a corresponding pattern of signals on said output electrode, said first-mentioned pattern characterized by a plurality of time slots in each of which said periodic signals are either present or absent, said last-mentioned pattern characterized by a plurality of corresponding time slots in each of which either said first or said second average voltage level is present;

signal means for establishing said pattern of periodic signals; and regenerating means responding to said pattern of signals on said output electrode by regenerating said pattern of periodic signals.

4. A recirculating memory arrangement as claimed in claim 3, wherein said input circuit means includes a delay line connected to said input electrode, said delay line having a delay time of a length such that said pattern of periodic signals can be established thereon.

5. A recirculating memory arrangement as claimed in claim 3, wherein said regenerating means includes a source of said periodic signals and coupling means coupled to said source and effective only when said transistor is saturated to couple said signals to said delay line to regenerate said pattern of periodic signals on said delay line.

6. A recirculating memory arrangement as claimed in claim 5, wherein said coupling means is a switch coupled to said output electrode and said delay line, said switch having unidirectional current conducting means biased in the high resistance direction when said first average voltage level is on said output electrode to block said signals from said delay line and biased in the low resistance direction when said second average voltage level is on said output electrode to couple said signals to said delay line.

7. A recirculating memory arrangement as claimed in claim 3, wherein said signal means includes a pulse input circuit coupled to said input electrode for supplying a train of pulses to said transistor to establish a pattern of operating states thereof, said pattern in turn establishing said pattern of periodic signals on said delay line.

8. A recirculating memory arrangement comprising, in combination:

an amplifying circuit including a single transistor with input and output electrodes, said circuit having a first operating state characterized by said transistor being cutoff and a first signal appearing on said output electrode and a second operating state characterized by said transistor being saturated and a second signal appearing on said output electrode;

a D.C. network connected to said input electrode to bias said transistor normally to cutoff;

a regenerative memory loop coupled to said input electrode, said loop including a source of sinusoidal signals, a delay line capable of supporting a signal pattern characterized by a plurality of time slots in each of which said sinusoidal signals are either present or absent, and a switch coupled to said source, said output electrode, and said delay line, said switch having unidirectional current conducting means biased in the high resistance direction when said first signal appears on said output electrode to block said sinusoidal signals from said delay line and biased in the low resistance direction when said second signal appears on said output electrode to couple said sinusoidal signals to said delay line, said sinusoidal signals having amplitude and frequency such that they bias said transistor to saturation;

a pulse input circuit coupled to said transistor for supplying a train of pulses to establish a pattern of operating states of said circuit, said pattern of operating states generating a signal pattern on said delay line, said signal pattern on said delay line, in turn, regenerating said pattern of operating states.

References Cited

UNITED STATES PATENTS 3,070,779 12/1962 Logue ------------- 307—88.5

TERRELL W. FEARS, *Primary Examiner.*